(12) United States Patent
Brennan et al.

(10) Patent No.: US 10,854,782 B2
(45) Date of Patent: Dec. 1, 2020

(54) MICRO-LED DEVICE

(71) Applicant: Facebook Technologies, LLC, Menlo Park, CA (US)

(72) Inventors: Vincent Brennan, Cork (IE); Christopher Percival, Cork (IE); Padraig Hughes, Cork (IE); Allan Pourchet, Cork (IE); Celine Claire Oyer, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/588,737

(22) Filed: Sep. 30, 2019

(65) Prior Publication Data

US 2020/0044114 A1     Feb. 6, 2020

Related U.S. Application Data

(63) Continuation of application No. 16/103,853, filed on Aug. 14, 2018, now Pat. No. 10,490,699, which is a
(Continued)

(30) Foreign Application Priority Data

Nov. 24, 2014   (GB) .................................. 1420860.7

(51) Int. Cl.
*H01L 21/00*     (2006.01)
*H01L 33/24*     (2010.01)
(Continued)

(52) U.S. Cl.
CPC ............ *H01L 33/24* (2013.01); *H01L 27/156* (2013.01); *H01L 33/06* (2013.01); *H01L 33/10* (2013.01);
(Continued)

(58) Field of Classification Search
CPC .......... H01L 33/24; H01L 33/58; H01L 33/32
See application file for complete search history.

(56) References Cited

U.S. PATENT DOCUMENTS 6,908,219 B1   6/2005   Reiss
7,518,149 B2   4/2009   Maaskant et al.
(Continued)

FOREIGN PATENT DOCUMENTS

CN    107112388 A    8/2017
EP    3224873 A1    10/2017
(Continued)

OTHER PUBLICATIONS

Japan Patent Office, Office Action, Japanese Application No. 2017-527777, dated Jan. 22, 2019, 4 pages.
(Continued)

*Primary Examiner* — Laura M Menz
(74) *Attorney, Agent, or Firm* — Fenwick & West LLP

(57) ABSTRACT

A Light emitting diode (LED) includes a mesa structure, a light emitting source within the mesa structure, and a primary emission surface on a side of the LED opposed to a top of the mesa structure. The light emitting source is configured to emit light anisotropically in a first direction perpendicular to a second direction of emission of the light from the LED at the primary emission surface.

20 Claims, 8 Drawing Sheets

Related U.S. Application Data continuation of application No. 15/528,730, filed as application No. PCT/EP2015/077332 on Nov. 23, 2015, now Pat. No. 10,074,774.

(51) Int. Cl.

| | | |
|---|---|---|
| *H01L 33/20* | (2010.01) | |
| *H01L 27/15* | (2006.01) | |
| *H01L 33/06* | (2010.01) | |
| *H01L 33/10* | (2010.01) | |
| *H01L 33/32* | (2010.01) | |
| *H01L 33/58* | (2010.01) | |
| *H01L 33/44* | (2010.01) | |
| *H01L 33/46* | (2010.01) | |

(52) U.S. Cl.
CPC .............. *H01L 33/20* (2013.01); *H01L 33/32* (2013.01); *H01L 33/58* (2013.01); *H01L 33/44* (2013.01); *H01L 33/46* (2013.01)

(56) References Cited

U.S. PATENT DOCUMENTS

| | | | |
|---|---|---|---|
| 7,750,425 B2 | 7/2010 | Forrest et al. | |
| 7,858,962 B2 | 12/2010 | Smith et al. | |
| 8,507,924 B2 | 8/2013 | Li | |
| 8,511,864 B2 | 8/2013 | Holder et al. | |
| 9,048,409 B2 | 6/2015 | Seo et al. | |
| 9,070,851 B2 | 6/2015 | Seo et al. | |
| 9,153,750 B2 | 10/2015 | Seo et al. | |
| 9,219,196 B2 | 12/2015 | Seo et al. | |
| 9,293,664 B2 | 3/2016 | Seo et al. | |
| 9,450,148 B2 | 9/2016 | Shepherd | |
| 9,543,490 B2 | 1/2017 | Seo et al. | |
| 9,825,200 B2 | 11/2017 | Lin et al. | |
| 9,882,102 B2 | 1/2018 | Seo et al. | |
| 9,941,328 B2 | 4/2018 | Shepherd | |
| 10,020,422 B1 | 7/2018 | Oyer | |
| 10,070,568 B2 | 9/2018 | Pourchet et al. | |
| 10,074,774 B2* | 9/2018 | Brennan | H01L 27/156 |
| 10,127,890 B2 | 11/2018 | Cotte | |
| 10,132,980 B2* | 11/2018 | Park | G02B 6/0073 |
| 10,325,791 B1 | 6/2019 | Saketi et al. | |
| 10,326,052 B1 | 6/2019 | Percival | |
| 10,490,599 B2* | 11/2019 | Thothadri | G02B 19/0028 |
| 10,490,699 B2* | 11/2019 | Brennan | H01L 33/10 |
| 10,559,730 B2* | 2/2020 | Thothadri | H04N 13/307 |
| 10,652,963 B2* | 5/2020 | Lee | H01L 33/44 |
| 10,720,098 B2* | 7/2020 | Valentine | G09G 3/3233 |
| 2006/0113638 A1 | 6/2006 | Maaskant et al. | |
| 2007/0210299 A1 | 9/2007 | Hirose et al. | |
| 2009/0179191 A1 | 7/2009 | Smith et al. | |
| 2011/0012147 A1 | 1/2011 | Bierhuizen et al. | |
| 2012/0206934 A1* | 8/2012 | Kim | H01L 25/167 362/602 |
| 2013/0175557 A1 | 7/2013 | Ray et al. | |
| 2015/0236201 A1 | 8/2015 | Shepherd | |
| 2015/0325746 A1 | 11/2015 | Percival | |
| 2017/0051884 A1 | 2/2017 | Raring et al. | |
| 2017/0084799 A1 | 3/2017 | Ouderkirk et al. | |
| 2017/0271557 A1* | 9/2017 | Brennan | H01L 33/32 |
| 2019/0011112 A1 | 1/2019 | Shito | |
| 2019/0013438 A1 | 1/2019 | Brennan et al. | |

FOREIGN PATENT DOCUMENTS

| | | | |
|---|---|---|---|
| GB | 201420860 | 1/2015 | |
| JP | 2005-252086 A | 9/2005 | |
| JP | 2006-525669 A | 11/2006 | |
| JP | 2007-242881 A | 9/2007 | |
| JP | 2011-512037 A | 4/2011 | |
| KR | 10-2017-0089888 A | 8/2017 | |
| WO | WO 2012/150647 | 11/2012 | |
| WO | WO 2013/121051 A1 | 8/2013 | |
| WO | WO-2013121051 A1 * | 8/2013 | ............. H01L 33/46 |
| WO | WO 2014/032997 | 3/2014 | |
| WO | WO 2016/083289 A1 | 6/2016 | |
| WO | WO 2016/122725 A1 | 8/2016 | |

OTHER PUBLICATIONS

PCT International Search Report and Written Opinion, PCT/EP2015/077332, dated Oct. 3, 2016, 9 pgs.

The State Intellectual Property Office of the People's Republic of China, Office Action, Chinese Application No. 2015800733984, dated Jan. 14, 2019, 9 pages.

* cited by examiner

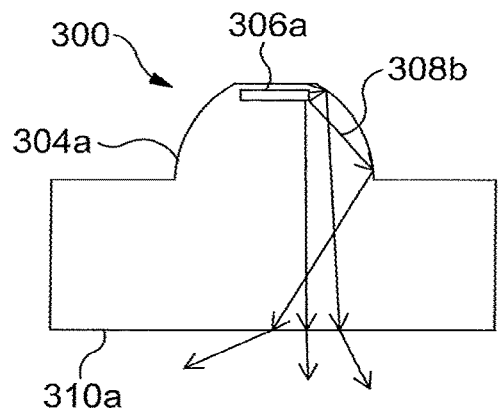
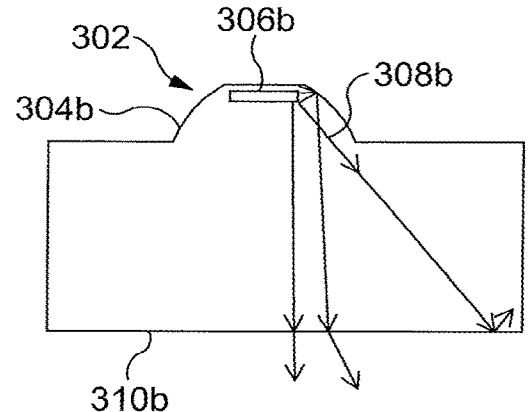
FIG. 2A
FIG. 2B
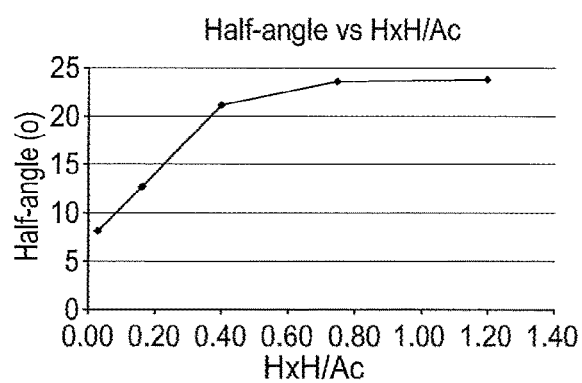
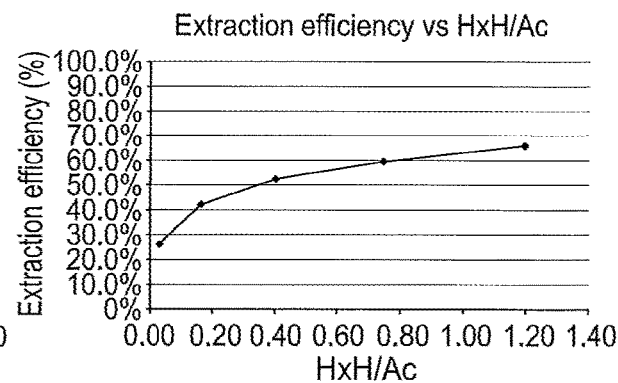
FIG. 3A
FIG. 3B

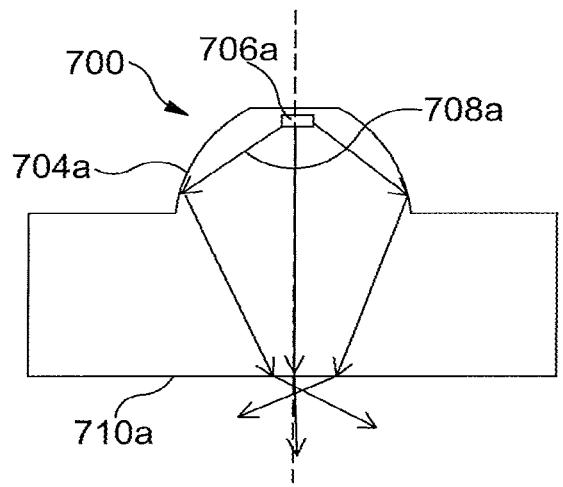
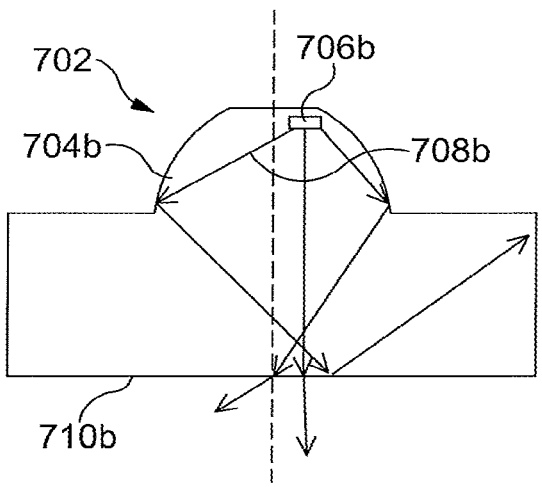
FIG. 6A              FIG. 6B
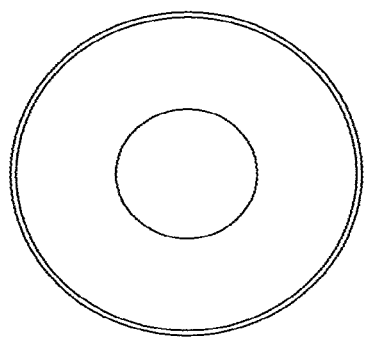
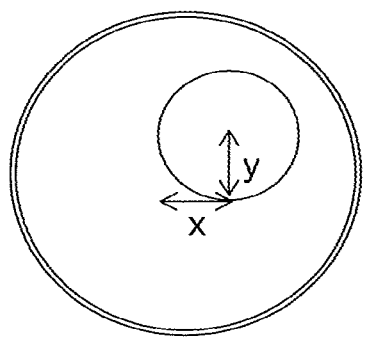
FIG. 7A              FIG. 7B

MICRO-LED DEVICE

CROSS REFERENCE TO RELATED APPLICATIONS

This application is a continuation of U.S. patent application Ser. No. 16/103,853, filed Aug. 14, 2018, which is a continuation of U.S. patent application Ser. No. 15/528,730, filed May 22, 2017, now U.S. Pat. No. 10,074,774, which is a National Phase application of International Application No. PCT/EP2015/077332, filed Nov. 23, 2015, which claims the benefit of United Kingdom Application No. GB1420860.7, filed Nov. 24, 2014, which are incorporated herein by reference in their entirety.

TECHNICAL FIELD

The invention relates to micro-LED (μLED) devices. More specifically, the invention relates to, but is not limited to, μLEDs having improved collimation of lightoutput.

BACKGROUND

When compared to standard LED devices, μLEDs may provide advantages of increased extraction efficiency (EE) and a "quasi-collimated" light output, that is, a light output that is at least partially directional. These advantages may be achieved by the introduction of a parabolic mesa structure to the μLED, in which an active layer or light emitting layer sits. Light that is emitted from the light emitting layer is reflected from the internal surface of the mesa and out of the μLED from an emission surface opposed to the mesa. Such a μLED is shown in U.S. Pat. No. 7,518,149.

There is a need for improvements to the μLEDs comprising a mesa structure to provide improved collimation of light.

SUMMARY

According to the invention in a first aspect, there is provided a micro-LED, μLED, comprising: a substantially parabolic mesa structure; a light emitting source within the mesa structure; and a primary emission surface on a side of the device opposed to a top of the mesa structure; wherein the mesa structure has an aspect ratio, defined by (H2*H2)/Ac, of less than 0.5, and the μLED further comprises a reflective surface located in a region from the light emitting source to the primary emission surface, wherein the reflective surface has a roughness, Ra, less than 500 nm.

Reflective surface as used herein encompasses a surface of a μLED to air, but more broadly, may also encompass an interface between two mediums. For example, a reflective surface may be a surface of a μLED between an emitting medium and another medium. The light may be partially or fully reflected depending on its incidence angle.

The primary emission surface is the surface of the μLED from which the majority of light is emitted. Typically, the primary emission surface may be a surface of an epilayer. The primary emission surface may be polished to achieve the desired surface roughness. In embodiments in which the epilayer abuts a substrate of a different material one or both of the primary emission surface and a surface of the substrate may have a surface roughness, Ra, less than 500 nm. Further, one or both of the primary emission surface and a surface of the substrate may be polished to achieve the desired surface roughness.

As shown below, the low aspect ratio is counterintuitive to the disclosure of the art, as is the low roughness of the reflective surface. The combination of these features allows parasitic rays emitted from the emission source to be internally reflected, thereby reducing the half angle (and increasing the collimation) of the μLED.

Previous μLEDs select a high aspect ratio and/or a rough or shaped reflective and/or emission surface to enhance the extraction efficiency. In exemplary μLEDs disclosed herein, a low roughness reflective surface and a low aspect ratio near-parabolic mesa are combined. These two parameters taken separately decrease the extraction efficiency, but it is demonstrated herein that, when combined, they provide a surprising effect of the enhancement of the light collimation.

Optionally, the reflective surface is the primary emission surface.

Optionally, the reflective surface has a roughness, Ra, of less than 300 nm.

Optionally, the reflective surface is an interface between a first material having a first refractive index and a second material having a second refractive index.

Optionally, the first material comprises an epilayer and the second material comprises a substrate upon which the μLED is fabricated.

Optionally, the μLED is formed from GaN on a sapphire substrate, and wherein the interface between two materials is the interface between the GaN and the sapphire substrate.

Optionally, the reflective surface has a roughness, Ra, less than 500 nm (and, in exemplary apparatus, less than 300 nm) in a region greater than or equal to a cross sectional area of a base of the mesa, and aligned with a central axis of the mesa. The region may be in a range from substantially equal to the cross sectional area of the base of the mesa to 1.5 times the cross sectional area of the base of the mesa.

Optionally, the aspect ratio of the mesa structure is less than 0.3.

Optionally, the mesa structure comprises a truncated top.

Optionally, the light emitting source is offset from a central axis of the mesa structure.

Optionally, the light emitting source is offset by a distance on one or both of perpendicular axes lying in a plane parallel to the primary emission surface.

Optionally, the offset distance in each of the perpendicular axes is in a range from 1 μm to 5 μm.

Optionally, the offset distance in each of the perpendicular axes is in a range from 10% to 50% of the total distance from the central axis to an edge of the mesa in each of the perpendicular axes.

Optionally, the light emitting source is configured to emit light anisotropically, such that the light is emitted from the light emitting source substantially in a direction perpendicular to the direction of emission of light from the μLED.

Optionally, the emission of light from the light emitting source is controlled using index guiding and/or dipole anisotropy.

Optionally, the μLED further comprises an additive layer applied to the primary emission surface, wherein the additive layer attenuates light incident thereon at a given angle and/or at above a given wavelength.

Optionally, the additive layer is a multi-level dielectric filter.

Optionally, the source occupancy of the light emitting source within a light emitting layer of the mesa structure is in a range from 20% to 50%.

According to the invention in a second aspect, there is provided a micro-LED, μLED, comprising: a substantially parabolic mesa structure; a light emitting source within the mesa structure; and a primary emission surface on a side of the device opposed to a top of the mesa structure; wherein the mesa structure has an aspect ratio defined by (H2*H2)/Ac less than 0.3.

According to the invention in a third aspect, there is provided a micro-LED, µLED, comprising: a substantially parabolic mesa structure; a light emitting source within the mesa structure; and a primary emission surface on a side of the device opposed to a top of the mesa structure; wherein the light emitting source is offset from a central axis of the mesa structure.

According to the invention in a fourth aspect, there is provided a micro-LED, µLED, comprising: a substantially parabolic mesa structure; a light emitting source within the mesa structure; and a primary emission surface on a side of the device opposed to a top of the mesa structure; wherein the light emitting source is configured to emit light anisotropically, such that light is emitted from the light emitting source substantially in a direction perpendicular to the direction of emission of light from the µLED.

According to the invention in a fifth aspect, there is provided a micro-LED, µLED, cluster comprising a plurality of µLEDs according to any described above and formed on a common substrate.

According to the invention in a sixth aspect, there is provided a display device comprising a plurality of µLEDs according to any described above.

According to a further aspect of the invention, there is provided a micro-LED, µLED, comprising: a substantially parabolic mesa structure; a light emitting source within the mesa structure; and a primary emission surface on a side of the device opposed to a top of the mesa structure; wherein light emitted from the light emitting source is anisotropic.

The anisotropic nature of the light emitted from the light emitting source may be in a direction substantially parallel to the primary emission surface, substantially perpendicular to a primary direction of emission of the µLED or substantially in a plane of the light emitting source. The light emitted by the light emitting source may be guided and/or encouraged within the mesa structure in a direction substantially parallel to the primary emission surface, substantially perpendicular to a primary direction of emission of the µLED or substantially in a plane of the light emitting source.

The light emitting source may be substantially planar. Further, the primary direction of emission of the µLED may be taken as a direction from a centre of the light emitting source and normal to the primary emission surface.

The light emitting source may be configured to emit light weighted towards a direction substantially parallel to the primary emission surface, substantially perpendicular to a primary direction of emission of the µLED or substantially in a plane of the light emitting source. The weighting may result in at least 50% of the emitted light being emitted in a range from 30 degrees, 25 degrees, 20 degrees, 15 degrees or 10 degrees either side of a direction substantially parallel to the primary emission surface, substantially perpendicular to a primary direction of emission of the µLED or substantially in a plane of the light emitting source.

The weighting may result in at least 40%, 50%, 60% or 70% of the emitted light being directly incident on an internal sidewall of the mesa structure.

The anisotropic light emitting source may form part of the guiding or may aid the guiding. That is, the guiding may be provided, at least in part, by the anisotropic emission of light from the light emitting source, or the guiding may be provided by configuration of a material within the mesa and aided by the anisotropic emission of light from the light emitting source.

BRIEF DESCRIPTION OF DRAWINGS

Exemplary embodiments of the invention will be described herein with reference to the accompanying drawings, in which:

FIGS. 2A and 2B are sections through µLEDs with mesa structures having different aspect ratios;

FIGS. 3A and 3B present the impact of aspect ratio variation over the half-angle and the extraction efficiency;

FIGS. 6A and 6B are sections through µLEDs with a centrally aligned emission source and an offset emission source;

FIGS. 7A and 7B are plan views of µLEDs with a centrally aligned emission source and an offset emission source;

DETAILED DESCRIPTION

Exemplary µLEDs disclosed herein describe features for improving the collimation of the light generated by a µLED and extracted from the device to a surrounding medium. This may be done by allowing the reflection of the parasitic light rays back inside the substrate by using a low aspect ratio mesa combined with a reflective surface in a region from the mesa structure to the primary emission surface of the µLED. For example, the reflective surface may be a polished primary emission surface or a reflective surface at a boundary between materials in the region from the mesa structure to the primary emission surface.

In this specification the term "light" will be used in the sense that it is used in optical systems to mean not just visible light, but also electromagnetic radiation having a wavelength outside that of the visible range. In addition, the term "parasitic light rays" may refer to light rays emitted from a light emitting source at a point away from a focal point of a mesa structure within the µLED. Such parasitic light rays may be reflected from an internal surface of the mesa in a way that deflects them from the collimated output that is expected if light is emitted from the focal point.

Further, the term "low aspect ratio" encompasses mesa aspect ratios less than 0.5 and, in specific exemplary μLEDs, less than 0.3. This is explained in greater detail below.

It is noted that a μLED may also be operated as a photodiode. Any reference to a μLED made herein therefore also encompasses photodiodes.

The prior art indicates that to have the best performance, μLEDs should have a high aspect ratio mesa structure and a rough or shaped surface through which the light passes or is extracted to the surrounding medium. This is dominated by the view that a high EE is the most desirable feature of a μLED. As shown herein, μLEDs with a low aspect ratio mesa structure and a relatively higher reflectivity (e.g. polished) emission surface have improved collimation whilst maintaining a satisfactory EE. Improved collimation can be the most desirable feature of a μLED for multiple applications, including but not limited to electro-optical systems requiring stray light and light path management or a display, as detailed below.

Figure 1:
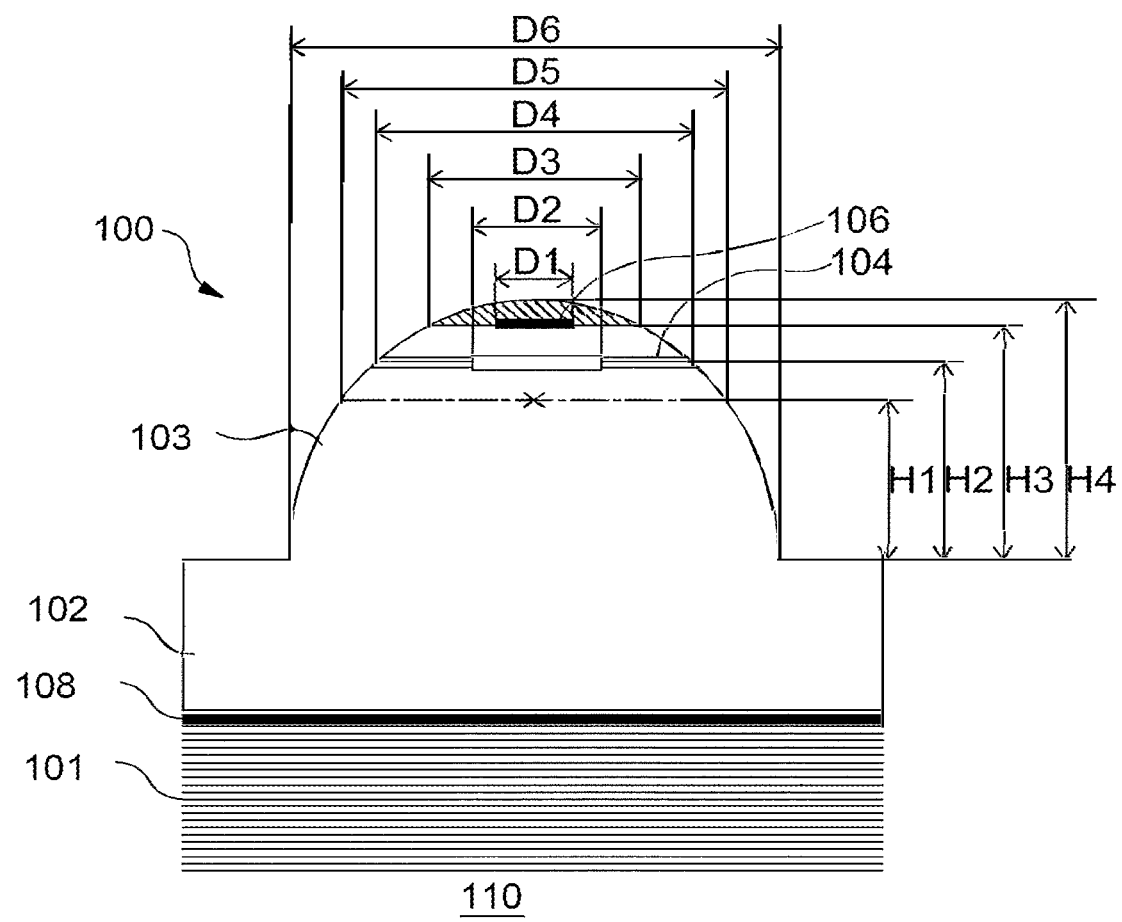
FIG. 1 is a section through a µLED.

FIG. 1 shows a μLED 100 having a parabolic mesa structure in which the light emitting layer sits. FIG. 1 defines the parameters of the mesa structure in order to aid description of the μLEDs disclosed herein. Referring to FIG. 1, a μLED 100 comprises, on a substrate 101 and a semiconductor layer 102, a mesa 103, a light emitting layer 104, and an electrical contact 106. In the exemplary μLED 100 of FIG. 1, an emission surface 108 of the μLED 100 is shown between the substrate 101 and the semiconductor 102. However, the emission surface 108 may alternatively be defined as between the μLED 100 and the surrounding medium 110, depending on the nature of the light emitting layer and the substrate. In addition, the μLED 100 comprises the following features and attributes:

H1: Height of paraboloid focal plane above the base of the mesa;
H2: Height of light emitting layer above the base of the mesa;
H3: Height of truncated top above the base of the mesa;
H4: Height of paraboloid top above the base of the mesa;
01: top electrical contact diameter;
02: light emitting source diameter
03: top of truncated semiconductor mesa diameter;
04: light emitting layer diameter;
05: diameter of the focal plane of a paraboloid (the focal plane being the horizontal plane that intersects the focal point); and
06: base of the semiconductor mesa diameter.

In addition, a further attribute of a μLED may defined as
Ac: Cross-sectional area of the mesa at the level of a light emitting source within the light emitting layer The mesa structure may or may not have a truncated top. In mesa structures having a truncated top, H3 is equal to H4. In mesa structures not having a truncated top, 03 is equal to zero. Further, H1 can be less than, equal to or greater than H2, which respectively defines the cases when the focal point is above, in or below the LEL. In other exemplary mesa structures, 01 can be less than, equal to or greater than 02 depending on current spreading or current confinement in the material.

It is noted that the size and dimensions of the features and attributes of FIG. 1 are exemplary and for the purposes of description and need not be indicative of the features and attributes of μLEDs 100 disclosed herein.

An aspect ratio of a near parabolic mesa may be defined as (H2*H2)/Ac. The aspect ratio may also be defined as (H3*H3)/Ac in cases where the top of the mesa structure is truncated. In practical terms, the difference between an aspect ratio determined by (H2*H2)/Ac and one determined by (H3*H3)/Ac is negligible in many cases and (H3*H3)/Ac may be used as a proxy for the more accurate (H2*H2)/Ac.

In addition, it is noted that the determination of the aspect ratio does not require a mesa structure having a circular cross-section. The aspect ratio may also be determined for irregular mesa structures, e.g. mesa structures that are slightly deformed or elongated. In cases where the mesa structure has a circular cross-section, Ac is determined by π*(D4/2)*(D4/2).

FIGS. 2A and 2B show μLEDs having near parabolic mesa structures with different aspect ratios. FIG. 2A shows a μLED 300 having a mesa structure with a relatively high aspect ratio, and FIG. 2B shows a μLED 302 having a mesa structure with a relatively low aspect ratio. In exemplary cases, μLED 300 may have an aspect ratio of greater than or equal to 0.5 and μLED 302 may have an aspect ratio of less than 0.5 and, in particular exemplary case, the aspect ratio may be less than or equal to 0.3.

In FIGS. 2A and 2B, μLEDs 300, 302 have near-parabolic mesa structures 304a, 304b encapsulating light emitting sources 306a, 306b. The parabolic mesa structure may or may not have a truncated top that is the top of the parabola is flattened above the level of the light emitting source. In known devices, the light emitted from the light emitting sources of the μLED devices 300, 302 is considered to originate from a point source. However, the inventors have appreciated that this is not a true reflection of the way light is emitted from the light emitting sources 306a, 306b. Rather, light is emitted across the entire area of the light emitting sources 306a, 306b and this must be modelled as an extended source, or a plurality of point sources. As shown in FIGS. 2A, and 2B, when emitted light is modelled in this way there is a surprising effect leading to an advantage of a low aspect ratio near parabolic mesa structure combined with low roughness extractive surface.

The collimation of the light output from a μLED may be described using the inherent property of a parabola: that light originating from a point source at the focal point of the parabola is collimated into a parallel beam. Based on this and the analysis of μLEDs as emitting light from a point source, it has been assumed in known devices that using a high aspect ratio mesa allows a better collimation, as the mesa structure gets closer to a perfect, infinite parabola.

However, as shown in FIG. 2B, when considering the whole μLED structure, including the light emitting from a non-point source, that is a source having a particular area, a counter-intuitive behaviour is observed. Parasitic light emission rays 308b may be internally reflected from an internal surface of the primary emission surface 310b leaving only light reflected off the internal surface of the mesa structure 304b to be emitted from the device 302. This effect is increased if the primary emission surface 310b is polished. As a result of this effect, the extracted beam emitted from the device 302 is more collimated when the near parabolic mesa structure aspect ratio is decreased. The inventors have appreciated this counter-intuitive behaviour that is due to the fact that the source cannot be considered as a single point source and this allows improvement of the light collimation output by combining a low aspect ratio mesa structure and a reflective (low roughness) surface.

In contrast, the μLED 300 of FIG. 2A has a near parabolic mesa structure with a high aspect ratio relative to the μLED 302. The aspect ratio of the μLED 300 may be 0.5 or greater. As can be seen in FIG. 2A, light rays emitted from the light emitting layer 306a that would be considered parasitic in μLED 302 are reflected from the internal surface of the mesa structure 304a and, as such, are emitted from the primary emission surface 310a instead of being internally reflected. This leads to enhanced extraction efficiency but reduced collimation of the output light, which, for many applications is an important parameter.

Decreasing the aspect ratio and using a relatively high reflective (e.g. polished) emission surface to have a better collimation is counter-intuitive to a skilled person. In addition, the improved collimation is offset by a reduction in EE although it is still satisfactory. This is considered undesirable in the art but actually has a wide range of applications.

In exemplary μLEDs 302, the aspect ratio may be less than 0.5. In other exemplary μLEDs 302, the aspect ratio may be less than 0.3. In other exemplary μLEDs 302, the aspect ratio may be less than 0.2. In other exemplary μLEDs 302, the aspect ratio may be less than 0.1. In other exemplary μLEDs 302, the aspect ratio may be in a range from 0.1 to 0.25 or in a range from 0.01 to 0.25.

In accordance with the above, the beam collimation of μLEDs may be increased by designing and processing the mesa structure to have an aspect ratio less than 0.5 and/or polishing the primary emission surface such that the surface roughness is reduced and the reflection properties are increased. The light emitting layer is encapsulated in a near-parabolic mesa structure. The near parabolic structure may be defined as a mesa with the tangent of a side-wall thereof intersecting the light emitting layer of the μLED at an angle a=45°+/−20° along a substantial part of a perimeter of the active layer, although, as mentioned above, parabolic mesa structures may also be deformed or elongated.

It is noted that the light emitting layer may not be the same as the light emitting source. In exemplary μLEDs, the light emitting layer defines the layer within the mesa structure in which the light emitting source sits. The light emitting layer may cover an area the same as the area of a cross section through the mesa structure at that level. The light emitting source may be the area of the light emitting layer that actually emits light. In exemplary μLEDs, the light emitting source may be smaller than the light emitting layer.

The mesa structure may have a low aspect ratio (typically H×H/Ac<0.5), where H is the height of the mesa and Ac the light emitting layer area. The primary emission surface may be fully or partially polished or may be treated to allow internal reflection of angled rays.

The combination of polished surface and low mesa aspect ratio allows the internal reflection of some unwanted parasitic rays, which have a large angle from the perpendicular of the primary emission surface and/or of the light emitting layer. If the primary emission surface is shaped (e.g., as a lens or other structure) the perpendicular to the primary emission surface cannot be so easily defined. In those cases the perpendicular may be defined as a perpendicular to the light emitting layer, or the axis of symmetry of the extracted beam. This allows enhancement of the emitted beam collimation.

In fact, the light emitting source area is modelled as multiple sources or an extended source, near or in the plane of the mesa focal point. This plane may coincide with the light emitting layer.

Rays emitted in any direction near the focal point of the mesa structure, but not at the exact focal point, may not be reflected in the parallel beam and increase the half-angle of the extracted beam (parasitic rays). The same may apply to light emitted from the light emitting source toward the top surface of the mesa structure (truncated top). When considering the light emitting source as a multiple or extended source, parasitic light is emitted and decreases the light collimation of the μLED.

By reducing the aspect ratio of the mesa, a percentage of parasitic rays are not reflected by the mesa structure, and thus propagated through the μLED directly to the primary emission surface, from which they are internally reflected. These parasitic rays can also be reflected by at an interface inside the material, for example at the interface GaN/Sapphire in case of a multi-material substrate or by a reflective coating layer between the substrate and the surrounding medium, or by any other reflective structures.

FIGS. 3A and 3B present the impact of the H×H/Ac (aspect ratio) variation over the half-angle, which allows quantifying the collimation, (FIG. 3A) and the extraction efficiency (FIG. 3B) for a specific near parabolic mesa structure and source area. FIG. 3A shows that aspect ratios below 0.5 show an unexpected decrease in half angle of the emitted beam, so an improvement of the light collimation. For different mesa structures and/or light emitting source areas, these results may change slightly.

Known μLEDs relate to enhancement of the EE by increasing the aspect ratio of the mesa structure beyond 0.5. However, in many applications, not only the extraction efficiency requires enhancement, but also the light collimation. In some cases, EE can be sacrificed to some degree in favour of better collimation.

Improvements in collimation of the light generated by a μLED and extracted from the device to the surrounding medium may be obtained by polishing the primary emission surface.

A rough or a shaped emission surface is conventionally used in the LED industry in order to maximize the extraction efficiency, at the expense of collimation. A rough primary emission surface reduces internal reflection of light. In exemplary μLEDs, polishing the primary emission surface allows an internal reflection of the parasitic light, which leads to an improved collimation. In exemplary μLEDs, the roughness of the primary emission surface defined by Ra may be 500 nm or less, 150 nm or less, 100 nm or less or 50 nm or less.

Figure 4A:
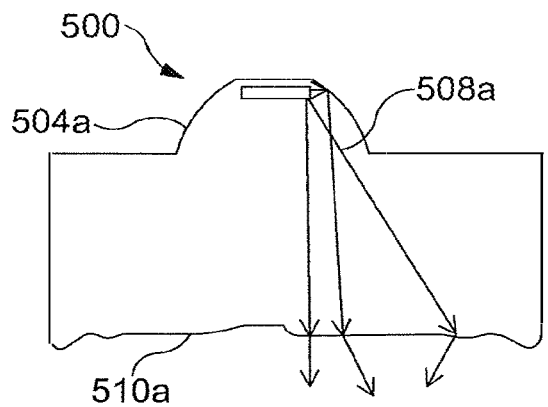
FIGS. 4A and 4B are sections through µLEDs with an unpolished (rough) primary emission surface and a polished (relatively less rough) primary emission surface.
Figure 4B:
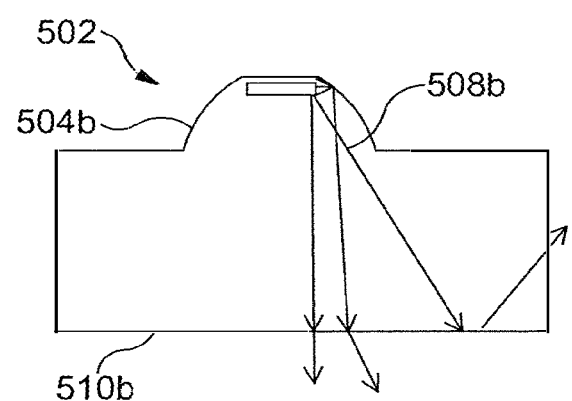

FIGS. 4A and 4B show μLEDs 500, 502 with an unpolished (rough) primary emission surface 510a and a polished (relatively less rough) primary emission surface 510b. As shown in FIG. 4A, when the primary emission surface 510a is unpolished, light rays 508a that have not been reflected off an internal surface of the mesa structure 504a interact with the primary emission surface 510a and, due to the roughness, the angle at which the light rays 508a are incident on the primary emission surface 510a may be such that the light is emitted from the device 500. This may increase EE, but it also increases the half-angle of the output light and so decreases collimation. In contrast, the primary emission surface 510b of the μLED 502 of FIG. 4B has a polished primary emission surface 510b, which is less rough than the primary emission surface 510a. Therefore, the same light rays 508b that were emitted by the device 500 are internally reflected. This may reduce the EE of the device but reduces the half-angle of the light output and so improves collimation.

Figure 5:
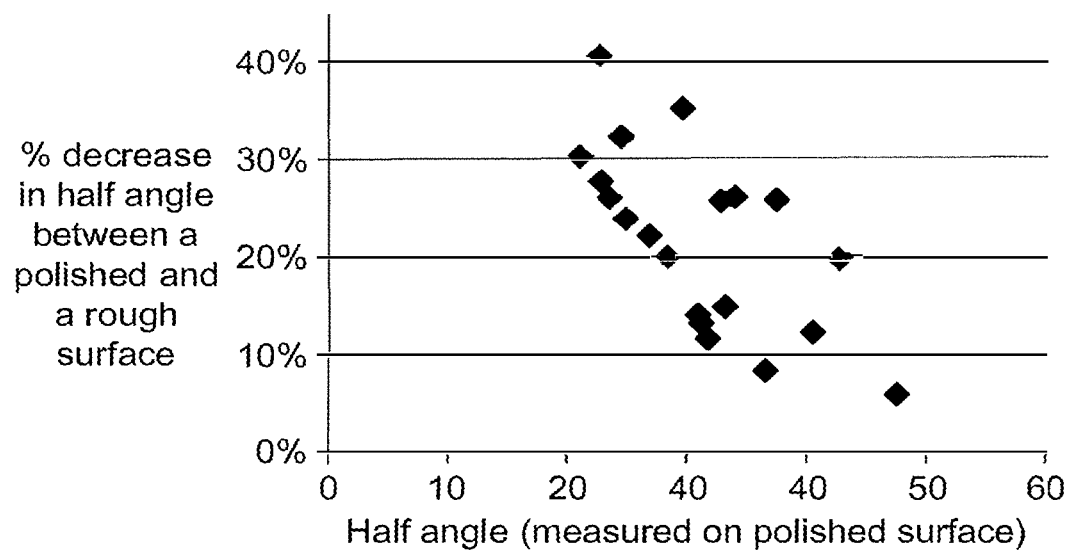
FIG. 5 shows the decrease in half angle of light emitted by a µLED due to reduction in roughness of a reflective surface of the µLED.

The half angle of several μLEDs has been measured with an exemplary polished primary emission surface with roughness Ra=47 nm. The primary emission surfaces of the μLEDs have then been roughened to Ra=556 nm. The half angle of the same micro-LEDs has been measured again. The results are plotted on FIG. 5. Referring to FIG. 5, a major improvement in beam collimation is observed when the primary emission surface is polished. A 20-40% improvement in beam collimation is observed for half angles below 25 degrees and a 5-20% improvement is observed for half angles above 25 degrees. This result highlights that the effect of polishing is more pronounced for a LED with naturally good collimation (i.e. a µLED).

Internal reflection from the primary emission surface may occur at a number of different angles dependent on the material that forms the primary emission surface and the material on the outer side of the primary emission surface. That is, the interface at the surface determines the critical angle at which light is internally reflected. In exemplary µLEDs, the reflective surface may be the primary emission surface, but in other exemplary µLEDs the reflective surface may be an interface surface between two materials. In other exemplary µLEDs, the interface may be provided by a single material that has a varying refractive index. In such µLEDs the refractive index of the material may continuously vary over an interface region. The wavelength of the emitted light may also affect the critical angle.

A number of critical angles are given below for the respective materials and wavelengths.

| First materia | Second materia | Wavelength | Critical angle |
|---|---|---|---|
| GaN | Sapphire | 440 nm | 44 |
| GaN | Water | 440 nm | 32 |
| GaN | Air | 440 nm | 23 |
| GaN | Air | 550 nm | 24.5 |
| GaP | Air | 650 nm | 17.6 |

It is also possible to combine a mesa shaped µLED with a reflective surface and an optimised light source shape or position to optimise the collimation of the extracted light.

Exemplary µLEDs may improve the collimation of the light generated by a micro-LED device and extracted from the device to the surrounding medium, by optimizing the position of the light emitting source in the mesa and taking advantage of the parasitic rays reflected back into the substrate (not extracted to the surrounding medium). That is, exemplary µLEDs may have a light emitting source that is offset from a central axis of the near parabolic mesa structure The misalignment of the light emitting source leads to more internal reflection of the parasitic light emitted by one side of the mesa. This may result in an asymmetric profile of the emitted beam from the µLED. FIGS. 6A and 6B show the principal. FIG. 6A shows µLEDs 700, 702 with differently positioned light emitting sources 706*a*, 706*b*. In FIG. 6A, the light emitting source 706*a* is centralised with respect to a central axis running vertically through the mesa structure 704*a*. In exemplary µLEDs the light emitting source 706*a* may be circular. In other exemplary µLEDs, the light emitting source 706*a* may be asymmetrical. In other exemplary µLEDs, the light source might be a ring around the centre with no emission at the centre (no emission at the focal plane).

Light generated at the light emitting source 706*a* is reflected off the internal walls of the mesa structure 704*a* and emitted from the device 700 through the primary emission surface 710*a*. It can be seen that light rays, such as 708*a*, generated at the periphery of the light emitting source 706*a* and/or contacting the lower edge of the mesa structure 704*a* are emitted from the device 700 and provide the limit of the half-angle of the beam. In contrast, referring to FIG. 6B, the light emitting source 706*b* of the device 702 is offset from the central axis of the mesa structure 704*b*. In such a configuration, light rays 708*b* contacting a lower edge of the mesa structure 704*b* are internally reflected from the primary emission surface 710*b* as the incident angle is reduced. As a result, the beam emitted from the device 702 is skewed but has greater collimation and a reduced half-angle.

Figure 8:
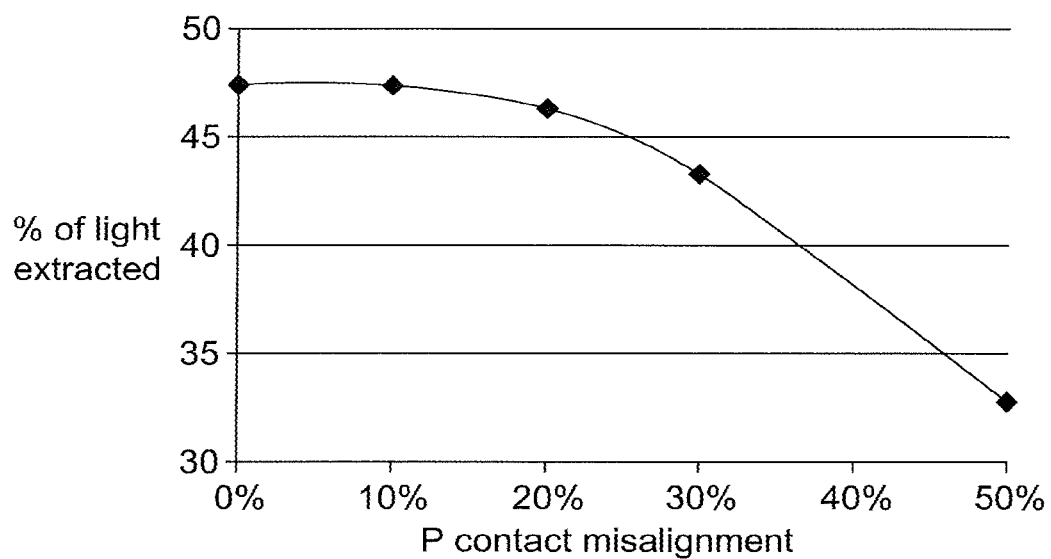
FIG. 8 shows the effect of P contact misalignment on EE in a µLED.
Figure 9:
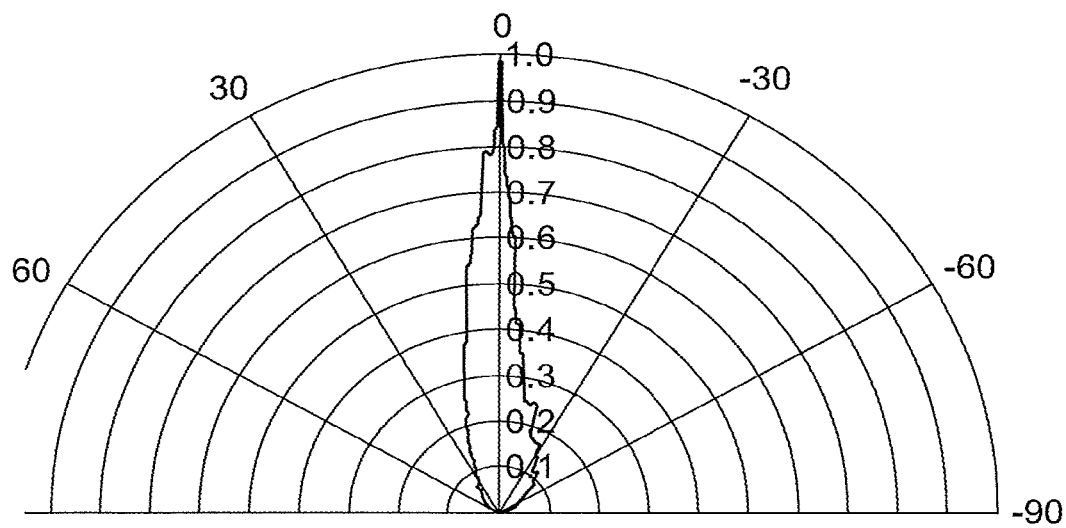
FIG. 9 shows a polar plot of a modelled µLED with a light emitting source offset from the central axis of the mesa structure by 30%, 30%.

FIGS. 7A and 7B show plan views of the µLEDs 700, 702. The misalignment of the light emitting source 706*b* is shown in FIG. 7B. FIG. 7A shows the light emitting source 706*a*, which is aligned with the central axis of the mesa structure 704*a*. Exemplary x offsets may be in the range from 1 to 5 µm or in a range from 0% to (04−02)/04% of the radius of the light emitting layer. Exemplary y offsets may be in the range from 1 to 5 µm or in a range from 0% to (04−02)/04% of the radius of the light emitting layer. Any combination of x and y offsets within those ranges is also possible. The x and y offsets may be in a range from 10% to 50% of the radius of the light emitting layer A model has been built where the light emitting source 706*b* was not at the centre of the mesa structure 704*b*. Different misalignment values have been modelled with x, y offsets of: 10%, 10%; 20%, 20%; 30%, 30%; and 50%/50%. These misalignment parameters resulted in asymmetrical beam shapes, while maintaining reasonable extraction efficiency, as shown in FIG. 8. FIG. 9 shows a polar plot of a modelled µLED with a light emitting source offset from the central axis of the mesa structure by 30%, 30%.

The collimation of light emitted from a µLED may also be improved by having an anisotropic light emitting source. That is, a light emitting source that emits light in only selected directions. An anisotropic source can enhance the collimation and extraction efficiency of a µLED by generating primarily those beam paths that are incident upon the near paraboloid mesa structure surface.

In exemplary µLEDs, source emission may be guided or encouraged perpendicular or primarily perpendicular to the device emission direction, that is, within the plane of the active layer of the µLED. In some exemplary µLEDs, the source emission may be guided substantially parallel to the primary emission surface of the µLED. It is counter-intuitive deliberately to guide light emission from a light emitting source in a plane perpendicular to the direction of the device emission, as typically light would be guided towards an emission surface. A source emission perpendicular or substantially perpendicular to the device emission direction coupled with a µLED mesa structure allows enhancing the extracted beam collimation and the extraction efficiency. If the source is isotropic then only a small proportion of the radiated light will be immediately incident upon the mesa internal reflective surface.

Figure 10A:
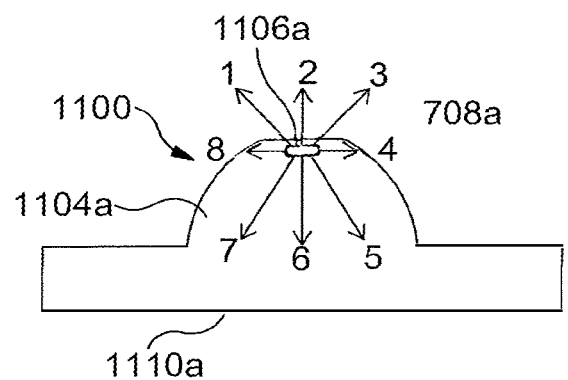
FIGS. 10A and 10B show µLEDs having isotropic and anisotropic light emitting sources.
Figure 10B:
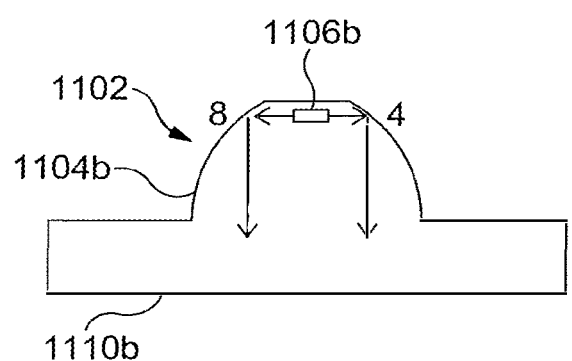

FIGS. 10A and 10B show µLEDs 1100, 1102, which have isotropic and anisotropic light emitting sources respectively. FIG. 10A shows light emitted from the light emitting source 1106*a* in all directions. Of the eight exemplary light rays emitted from the light emitting source 1106*a*, only light rays 8 and 4 are immediately incident upon the mesa structure internal reflective surface. The remaining light rays mostly contribute to internal scattering and loss, reducing the extraction efficiency, or exit the surface without being guided by the mesa, broadening the collimated emitted beam. The light rays other than 8 and 4 are typically reflected from the planar top surface of the mesa 1104*a* (light rays 1 and 3), not reflected by the mesa but propagated into the substrate (light rays 5 and 7) or coincidentally contribute to (but broaden) the collimated beam either directly (light ray 6) or after planar reflection (light ray 2).

In exemplary µLEDs, more than 50% of the light emitted from the light emitting source is substantially perpendicular to the direction of emission, which may be defined by a normal to the light emitting layer. In other exemplary µLEDs, more than 80% of the light emitted from the light emitting source is substantially perpendicular to the direction of emission. In other exemplary µLEDs, more than 90% of the light emitted from the light emitting source is substantially perpendicular to the direction of emission.

The proportion of the light rays that contribute to internal scattering may increase as the aspect ratio of the mesa structure is reduced and may negatively impact on the extraction efficiency of the µLED 1100. Therefore to enhance extraction efficiency it is advantageous to eliminate parasitic light rays 1, 3, 5 and 7 by source anisotropy.

The anisotropic light emitting source 1106b shown in FIG. 10B emits predominantly in the plane of the quantum wells of the light emitting source 1106b. A greater proportion of the generated light is incident upon the inner reflective surface of the mesa structure 1104b and a smaller proportion of generated light contributes to internal scattering and loss of the µLED.

An anisotropic source may be created in several ways, not limited to the examples given below:

Index guiding: an epitaxial structure is modulated with the quantum wells of the light emitting source 1106b embedded in low refractive index material and higher refractive indices in outer cladding regions. This has the effect of guiding (bending) generated light back into the plane of the quantum wells. Thus the quantum well emission may be isotropic but the index guiding of the cladding guides the light emitted from the light emitting source 1106b to be away from loss paths, e.g. perpendicular to the direction of emission of the µLED 1102.

Dipole Anisotropy: some semiconductor materials exhibit a spatial separation of electron and hole states, such that a dipole effect is apparent in certain planes. GaN has polar, semi-polar and non-polar planes. This spatial separation impacts the probability of recombination in certain polarisations which is linked to the direction of propagation. This can lead to enhanced photon emission in certain planes and suppressed photon emission in others, with the photons then exhibiting associated polarisation effects. This effect may be used to encourage light to be emitted from the light emitting source in a direction perpendicular to the direction of emission of the µLED 1102.

Exemplary µLEDs utilise refractive index guiding or crystal anisotropy effects to encourage propagation of light in the plane of the quantum wells.

In exemplary µLEDs, the anisotropic emission of light from the light emitting source may increase the extraction efficiency and/or the collimation of the light emitted from the µLED without the need to have a reflective region or low roughness surface in a range from the light emitting source to the primary emission surface.

Collimation of the light generated by a µLED and extracted from the µLEDs to the surrounding medium may also be reduced by the application of additive layers on the primary emission surface.

Additive layers applied to the primary emission surface may exhibit an angular dependence, that is, they may attenuate, reflect or propagate light incident on them based on the angle of incidence of the light. When applied to a µLED this effect may improve collimation by, for example, attenuating light incident on the additive layer at higher angles with respect to a normal to the primary emission surface. Conversely the transmission of the applied layer may be enhanced by application to a collimated source that matches the known angular dependence.

Treatment of µLEDs on the primary emission surface may include the addition of layers with several alternative functions included but not limited to wavelength bandpass, high-pass, low-pass, reflecting or antireflecting filters. Such additive layers are known to have an angle of incidence (AOI) dependency that typically manifests as a loss mechanism when a filter is applied to a non-collimated device acting as a broad emission-angle source. Whilst the primary function of these filters is not to affect a beam profile, the AOI dependency means that as a secondary effect they can have beam shaping properties that enhance the functionality of the µLED by improving collimation, suppressing scattered light and reducing cross-talk in arrays of devices. Further, the performance of these layers may be enhanced relative to non-collimated sources, as the associated loss of power at higher angles is greatly reduced when applied to a µLED.

Figure 11:
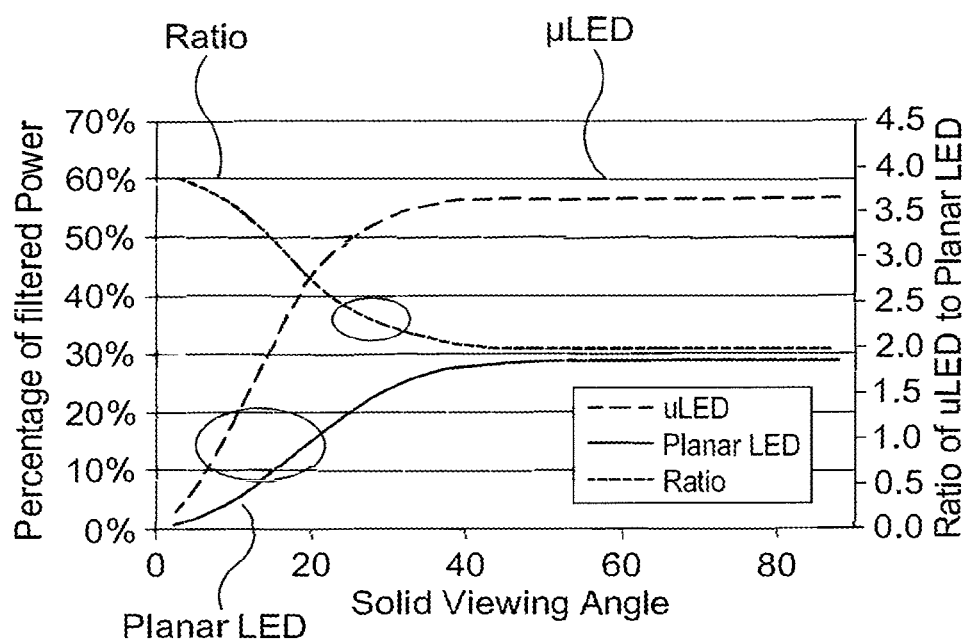
FIG. 11 shows a plot of transmission through a multi-layer dielectric filter applied as an additive layer to a µLED with an emission half-angle of 20° and a typical planar LED with a lambertian profile.

FIG. 11 shows a plot of transmission through a band pass filter applied as an additive layer to a µLED with an emission half-angle of 20° and a typical planar LED with a lambertian profile. The band pass filter heavily attenuates light incident on it at angles above 30°. The plot also shows the ratio of the µLED transmission and the planar LED transmission through the filter. It can be seen that at small angles of incidence the µLED delivers up to four times more power, and over the whole hemisphere the µLED delivers twice as much power as a planar device.

In µLED devices that have been treated as an additive layer to the primary emission surface with a bandpass filter having a dependence on the AOI of the light passing through it, an enhancement of collimation of emitted light is seen. For a non-collimated LED device, this has the effect of attenuating the output. However for a µLED device, it was found that the higher angles with respect to the normal to the primary emission surface in a partially collimated beam were attenuated more than those with a smaller angle. The collimation of the light emitted from the µLED is therefore increased. In the example, the application of the filter enhances the average Half-Width-Half-Maximum (=half-angle) from 44° to 26°.

The transmission loss through the filter is less for a µLED than when using a planar LED, as the application of a filter to a micro-LED yields a more efficient system.

In exemplary µLEDs a multi-level dielectric filter may be used. The filter may have a pass band of 10 nm to 30 nm (in a particular example, 20 nm) and a nominal transmission wavelength anywhere in the visible region from 400 to 700 nm. Other proprietary filters can be applied from deep UV, through optical wavelengths to infra-red wavelength, with low-pass band-pass or high-pass properties that all display an angular dependence resulting in an improvement of µLED collimation. Light at angles of >10° from a normal to the light emitting layer experience attenuation effects and the majority of emission above 30° is not transmitted. More general types of additive layers are formed from multiple layers of dielectric film, each layer typically of the order λ/4 thickness.

Exemplary µLEDs disclosed herein may have improved wall-plug efficiency by designing the light emitting source area regarding the polished primary emission surface reflection properties. The light emitting source, defined by its area, i.e. Sarea, is encapsulated in a near-parabolic mesa structure which may have a truncated top. The near parabolic mesa structure may be defined as a mesa with the tangent of the side-wall intersecting the active layer at an angle a=45° (+/−200) along a substantial part of a perimeter of the active layer. The active layer, also called the light emitting layer LEL, is defined by its area LELarea. The source occupancy is defined by the source area over the light emitting layer area: Sarea/LELarea. For circular mesa, another way to define the source occupancy is $O2*O2/(O4*O4)$. The mesa may have a low aspect ratio (H2×H2/Ac<0.5. The primary emission surface may be polished (or treated to allow internal reflection of angled rays). The wall plug efficiency is optimized while enlarging the source area It is commonly admitted in the prior art that a μLED structure with a near parabolic shape has better extraction efficiency with small source occupancy. For example, U.S. Pat. No. 7,518,149 discloses a particularly high efficiency if the contact occupies less than 16% of the truncated top mesa surface area. This statement tends to indicate that more light is extracted from a μLED device when the source occupancy is reduced; i.e. that the wall plug efficiency is higher. Nevertheless, when the source occupancy is reduced, the contact is reduced and so the current density increases. So, for a same input power (I×V), depending on the IV characteristics of the material, more electrons can be injected through a large contact, and so more photons can be produced.

There is a compromise between photon generation and photon extraction from the material. At same input power, a large source generates more photons but a smaller percentage of these photons will be extracted from the material. Exemplary μLEDs disclosed herein show that it is possible to optimize the wall plug efficiency of a μLED by enlarging the source occupancy.

Figure 12:
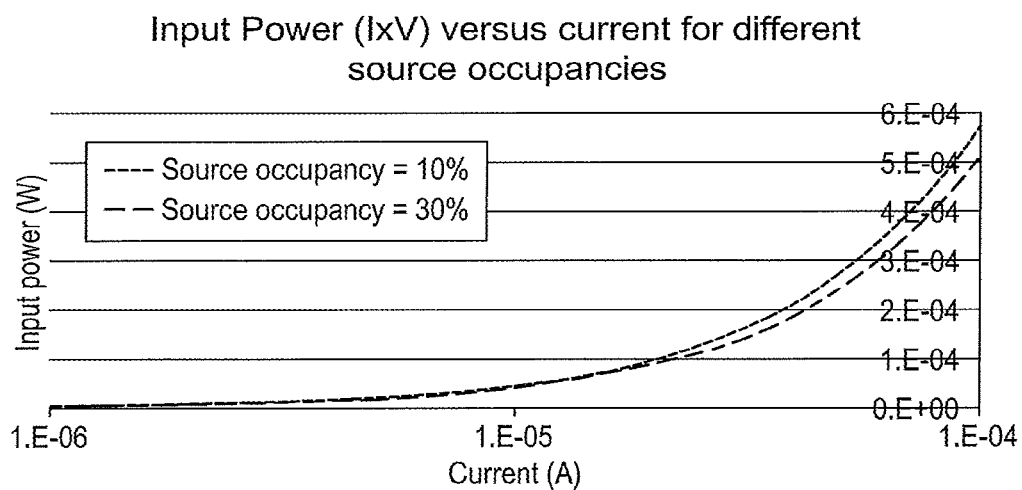
FIG. 12 presents the power against current characteristics for processed µLEDs.

FIG. 12 presents the power vs current characteristics for processed μLEDs (GaN with NiAu contact).

Figure 13:
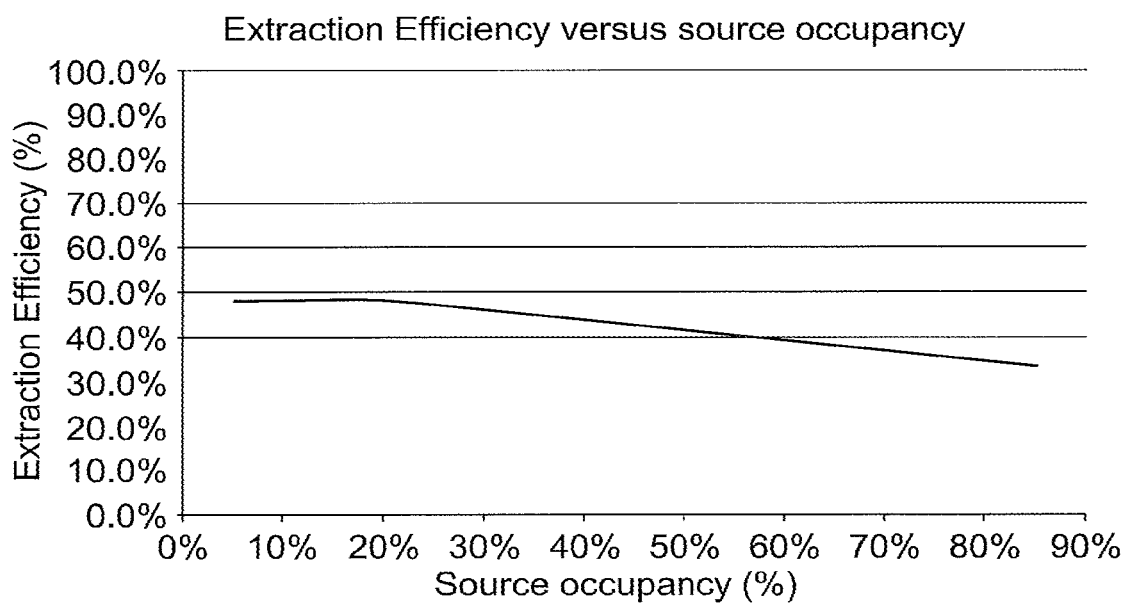
FIG. 13 shows the EE of µLEDs with various source occupancies.

In an exemplary μLED, for an input power of 0.5 mW: 90 μA can be injected for a source occupancy of 10%; and 98 μA can be injected for a source occupancy of 30%. The extraction efficiency may vary between the two designs due to the loss of collimation for a large source. For the specific mesa structure modelled, the extraction efficiency varies from: 48.2% for a source occupancy of 10% to 45.9% for a source occupancy of 30%. FIG. 13 shows the extraction efficiency (EE) of μLEDs with various source occupancies for a specific mesa design. Other designs (mesa aspect ratio, geometrical coefficients, . . . ) might bring slightly different results.

For a large source (e.g., 30%), the number of generated photons may increase by 9.2%, which, considering the loss due to the decrease of the extraction efficiency, still allows an overall increase of the wall plug efficiency of almost 4%.

Figure 14:
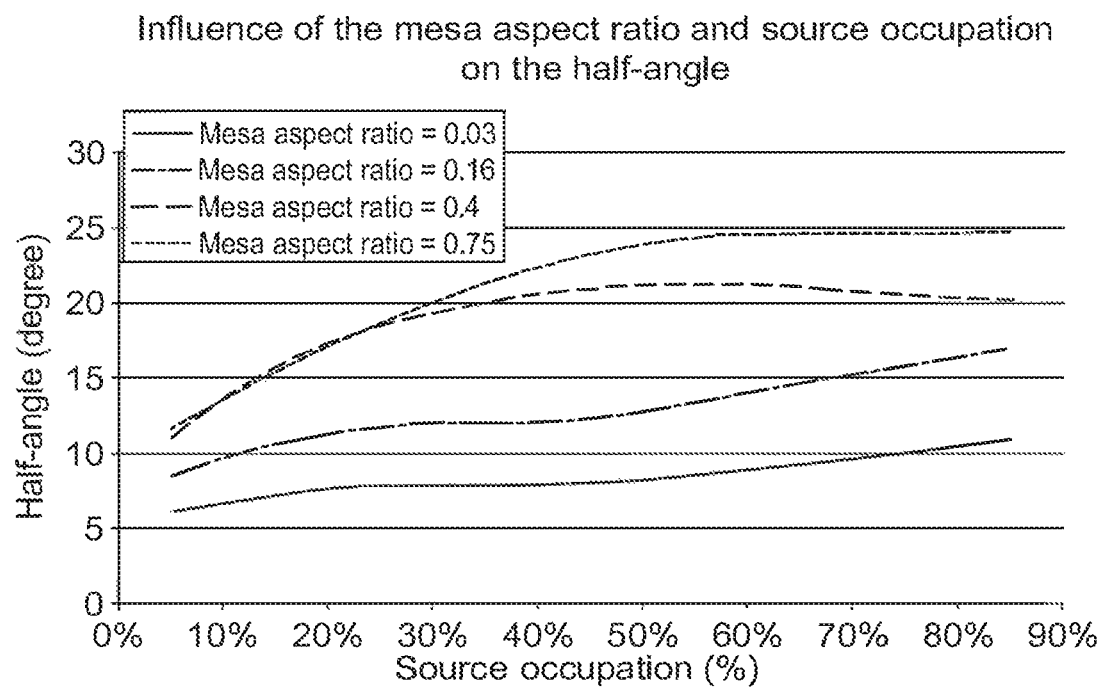
FIG. 14 shows the influence of mesa aspect ratio and source occupancy on emission half angle.

A low aspect ratio mesa structure (e.g. below 0.5) with a polished surface with low roughness for reflecting parasitic rays allows an improvement of the half angle of emitted light when compared to a high aspect ratio mesa structures. Enlarging the source occupancy increases the half-angle. So, for the same collimation requirement, a low aspect ratio mesa with an enlarged source occupancy can be used as shown in FIG. 14. For a same half-angle requirement (10 degrees, for example), the mesa structure can be designed with a high aspect ratio (e.g., greater than 0.5) and a small source occupancy (e.g., 10% or less), or a low aspect ratio (e.g., less than 0.5) and a large source occupancy (e.g., greater than 50%).

Enlarged source occupancies up to 100% can be utilised in real μLED applications and achieve acceptable levels of collimation when combined with low aspect ratio mesa structures. A high aspect ratio design with large source occupancy could result in unacceptable collimation. This allows trade-off of collimation with factors of forward voltage, manufacturability etc.

Exemplary μLEDs disclosed herein provide advantages for stray light and light path management for electro-optical systems. Exemplary μLEDs simplify an optical system and packaging by removing bulk optics. In addition, exemplary μLEDs may remove background noise, reduce power requirement and/or reduce cross-talk between elements.

There may also be complementary benefits for display applications, such as, in direct view displays: narrow viewing angle displays or privacy displays; removal of backscatter for display contrast enhancement; and/or reduction of cross-talk between pixels to reduce pixel blur. Also, in display backlighting applications, exemplary μLEDs may: optimize the light coupling to the light-guide backplane; decrease the external losses; and/or enable different power savings backlighting architectures.

Any of the features mentioned above may be applied to μLEDs either alone or in any combination thereof. In addition, the skilled person will be able to envisage other embodiments of the invention in accordance with the accompanying claims.

What is claimed is:

1. A light emitting diode (LED), comprising:
   a mesa structure;
   a light emitting source within the mesa structure; and
   a primary emission surface on a side of the LED opposed to a top of the mesa structure;
   wherein the light emitting source is configured to emit light in multiple directions anisotropically, more light is emitted from the light emitting source in directions parallel to the primary emission surface than in other directions.

2. The LED of claim 1, wherein the light emitting source emits the light in a plane of quantum wells of the light emitting source.

3. The LED of claim 1, wherein a greater proportion of the light from the light emitting source is incident upon an inner reflective surface of the mesa structure and a smaller proportion of the light from the light emitting source contributes to internal scattering and loss.

4. The LED of claim 1, wherein more than 80% of the of the light from the light emitting source is emitted in the directions parallel to the primary emission surface.

5. The LED of claim 1, wherein more than 90% of the of the light from the light emitting source is emitted in the directions parallel to the primary emission surface.

6. The LED of claim 1, wherein:
   the light emitting source includes quantum wells embedded in a first material;
   the LED further includes cladding regions of a second material surrounding the light emitting source; and
   the first material includes a lower refractive index than the second material.

7. The LED of claim 1, wherein the light emitting source includes polar, semi-polar and non-polar planes.

8. The LED of claim 1, wherein the light emitting source includes a semiconductor material with dipole anisotropy.

9. The LED of claim 1, further comprising an additive layer on the primary emission surface that attenuates incident light above a critical angle.

10. The LED of claim 1, further comprising an additive layer on the primary emission surface that attenuates incident light above a given wavelength.

11. The LED of claim 1, further comprising at least one of a wavelength bandpass filter, a high-pass filter, a low-pass filter, a reflecting filter, or an antireflecting filter on the primary emission surface.

12. The LED of claim 1, wherein the mesa structure is parabolic.

13. The LED of claim 12, wherein the mesa structure includes a truncated top.

14. The LED of claim 1, further comprising a reflective surface located in a region from the light emitting source to the primary emission surface.

15. The LED of claim 14, wherein the reflective surface is the primary emission surface.

16. The LED of claim 14, wherein reflective surface has a roughness Ra less than 300 nm.

17. The LED of claim 14, wherein the reflective surface is an interface between a first material having a first refractive index and a second material having a second refractive index.

18. The LED of claim 17, wherein the first material comprises an epilayer and the second material comprises a substrate upon which the LED is fabricated.

19. The LED of claim 17, wherein the LED is formed from GaN on a sapphire substrate, and wherein the interface between the first and second materials is the interface between the GaN and the sapphire substrate.

20. A display device, comprising:
a light emitting diode (LED), including:
  a mesa structure;
  a light emitting source within the mesa structure; and
  a primary emission surface on a side of the LED opposed to a top of the mesa structure;
  wherein the light emitting source is configured to emit light in multiple directions anisotropically, more light is emitted from the light emitting source in directions parallel to the primary emission surface than in other directions.

* * * * *

UNITED STATES PATENT AND TRADEMARK OFFICE
CERTIFICATE OF CORRECTION

PATENT NO. : 10,854,782 B2  
APPLICATION NO. : 16/588737  
DATED : December 1, 2020  
INVENTOR(S) : Brennan et al.

Page 1 of 1

It is certified that error appears in the above-identified patent and that said Letters Patent is hereby corrected as shown below:

In the Claims

In Column 14, in Claim 4, Lines 45-46, delete "of the of the" and insert -- of the --, therefor.

In Column 14, in Claim 5, Lines 48-49, delete "of the of the" and insert -- of the --, therefor.

In Column 15, in Claim 16, Line 15, after "wherein" insert -- the --.

Signed and Sealed this  
Eleventh Day of May, 2021

Drew Hirshfeld  
*Performing the Functions and Duties of the*  
*Under Secretary of Commerce for Intellectual Property and*  
*Director of the United States Patent and Trademark Office*